(12) United States Patent
Ali et al.

(10) Patent No.: US 7,863,716 B2
(45) Date of Patent: Jan. 4, 2011

(54) METHOD AND APPARATUS OF POWER RING POSITIONING TO MINIMIZE CROSSTALK

(75) Inventors: Anwar Ali, San Jose, CA (US); Tauman T Lau, San Jose, CA (US); Kalyan Doddapaneni, Sunnyvale, CA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 12/507,831

(22) Filed: Jul. 23, 2009

(65) Prior Publication Data
US 2009/0321897 A1 Dec. 31, 2009

Related U.S. Application Data

(62) Division of application No. 11/590,961, filed on Oct. 31, 2006, now Pat. No. 7,569,472.

(51) Int. Cl.
*H01L 23/495* (2006.01)
(52) U.S. Cl. .................. 257/666; 257/782; 257/784; 257/E23.06

(58) Field of Classification Search ............... 257/666, 257/691, 735, 782, 784, E23.06
See application file for complete search history.

(56) References Cited

U.S. PATENT DOCUMENTS 6,765,301 B2 * 7/2004 Wu et al. .................... 257/782

\* cited by examiner

*Primary Examiner*—Hoai v Pham
(74) *Attorney, Agent, or Firm*—Raj Abhyanker, P.C.

(57) ABSTRACT

A method and/or an apparatus of power ring positioning to minimize crosstalk are disclosed. In one embodiment, a method includes generating an array of fingers between a power ring and a die, applying a signal wire between a bond pad of the die and a particular finger of the array of fingers, and applying a shielding wire between an adjacent bond pad and the power ring, such that the shielding wire is longer than the signal wire and does not couple to any of the array of fingers. The shielding wire may be placed between adjacent ones of the signal wire to minimize crosstalk between the adjacent ones of the signal wire.

6 Claims, 5 Drawing Sheets

US 7,863,716 B2

METHOD AND APPARATUS OF POWER RING POSITIONING TO MINIMIZE CROSSTALK

CLAIM OF PRIORITY

This is a Divisional application which claims priority from U.S. Utility patent application Ser. No. 11/590,961 titled "METHOD AND APPARATUS OF POWER RING POSITIONING TO MINIMIZE CROSSTALK" filed on Oct. 31, 2006 now U.S. Pat. No. 7,569,472.

FIELD OF TECHNOLOGY

This disclosure relates generally to the technical fields of electronics and integrated circuit (IC) technology and, in one example embodiment, to a method and/or an apparatus power ring positioning to minimize crosstalk.

BACKGROUND

A wire used in wire bonding may behave more like a transmission line as speed increases. As this happens, intrinsic inductance and/or capacitance of an adjacent wire and the wire may cause signal integrity issues as switching of voltages of the wire creates an unwanted voltage alteration on the adjacent wire. A shielding wire may be used in between the wire and the adjacent wire (e.g., the shielding wire may be coupled to a fixed voltages source like VDD or ground).

The shielding wire may run along an entire length of the wire and the adjacent wire. As a result, the shielding wire may be connected to shielding fingers (e.g., junction points where the shielding wire and signal wires may be coupled), which are usually limited in quantity (e.g., because the signal fingers may contribute to a physical size of an integrated circuit). Reserving signal fingers for the shielding wire may increase cost of the integrated circuit (e.g., increase in material cost, heat, etc.).

In addition, as more and more signal fingers are placed on the integrated circuit, the signal fingers move further along a periphery. As a result, the periphery may be bigger and may move farther away from bond pads. This may cause stray coupling between wires. Furthermore, having more of the shielding wire may require additional input/output devices which can also contribute to increased costs of the integrated circuit.

SUMMARY

A method and/or an apparatus of power ring positioning to minimize crosstalk are disclosed. In one aspect, a method includes generating an array of fingers between a power ring and a die, applying a signal wire between a bond pad of the die and a particular finger of the array of fingers, and applying a shielding wire between an adjacent bond pad and the power ring, such that the shielding wire is longer than the signal wire and does not couple to any of the array of fingers.

The shielding wire may be placed between adjacent ones of the signal wire to minimize crosstalk between the adjacent ones of the signal wire. The method may include creating at least one of the shielding wire and the signal wire from a metal including copper, aluminum, silver, and/or an aluminum doped alloy. The array of fingers may be moved directly adjacent to the die, such that a length of the signal wire decreases by at least 20% from that of a design in which the power ring is located between the die and the array of fingers. A silicon area of the die may be decreased because separate shielding input/output devices may not be required when the shielding wire does not couple to any of the array of fingers. An effect of a crosstalk may be minimized when the shielding wire is between two signal wires on either side of the shielding wire. The crosstalk may be further reduced by shortening the signal wire from a design in which the power ring is located between the die and the array of fingers.

In another aspect, a method includes generating a power ring between an array of fingers and a die, coupling a set of conductive arms which each perpendicularly extend from the power ring to a location at a farthest edge of each finger of the array of fingers, applying a signal wire between a bond pad of the die and a particular finger of the array of fingers, and applying a shielding wire between an adjacent bond pad and the power ring, such that the shielding wire is substantially equal in length to the signal wire and such that the shielding wire couples to a particular conductive arm of the set of conductive arms rather than to any of the array of fingers.

In yet another aspect, a microelectronic assembly includes a die between a high density multilayer wiring board and a resin, a power ring and an array of fingers of the high density wiring board adjacent to the die, a set of conductive arms which each perpendicularly extend from the power ring to a location at a farthest edge of each finger of the array of fingers, a set of signal wires each between a bond pad of the die and a particular finger of the array of fingers, and a set of shielding wires each between an adjacent bond pad and the power ring, such that each shielding wire is substantially equal in length to each signal wire and such that each shielding wire couples to a particular conductive arm of the set of conductive arms rather than to any of the array of fingers.

The methods, systems, and apparatuses disclosed herein may be implemented in any means for achieving various aspects, and may be executed in a form of a machine readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

A method and/or an apparatus of power ring positioning to minimize crosstalk are disclosed. In the following description, for the purposes of explanation, numerous specific details are set forth in order to provide a thorough understanding of the various embodiments. It will be evident, however to one skilled in the art that the various embodiments may be practiced without these specific details.

Figure 1:
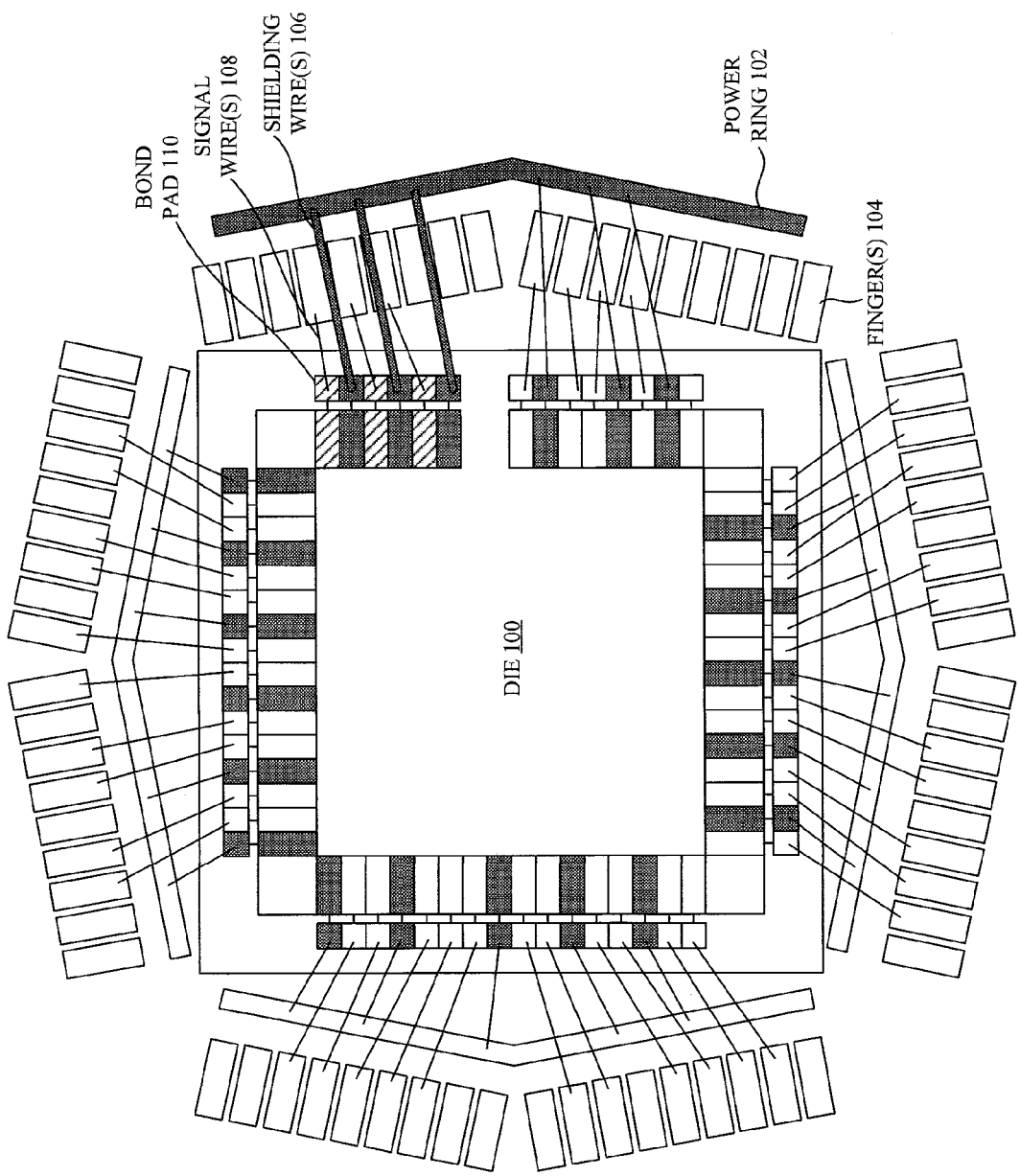
FIG. 1 is a cross-sectional view of a wire bond package and die connection layout, according to one embodiment.

In one embodiment, a method includes generating an array of fingers (e.g., fingers 104 of FIG. 1) between a power ring (e.g., a power ring 102 of FIG. 1) and a die (e.g., a die 100 of FIG. 1), applying a signal wire between a bond pad (e.g., a bond pad 110 of FIG. 1) of the die and a particular finger of the array of fingers (e.g., fingers 104 of FIG. 1), and applying a shielding wire between an adjacent bond pad and the power ring, such that the shielding wire is longer than the signal wire and does not couple to any of the array of fingers (e.g., as described in FIG. 1).

Figure 2:
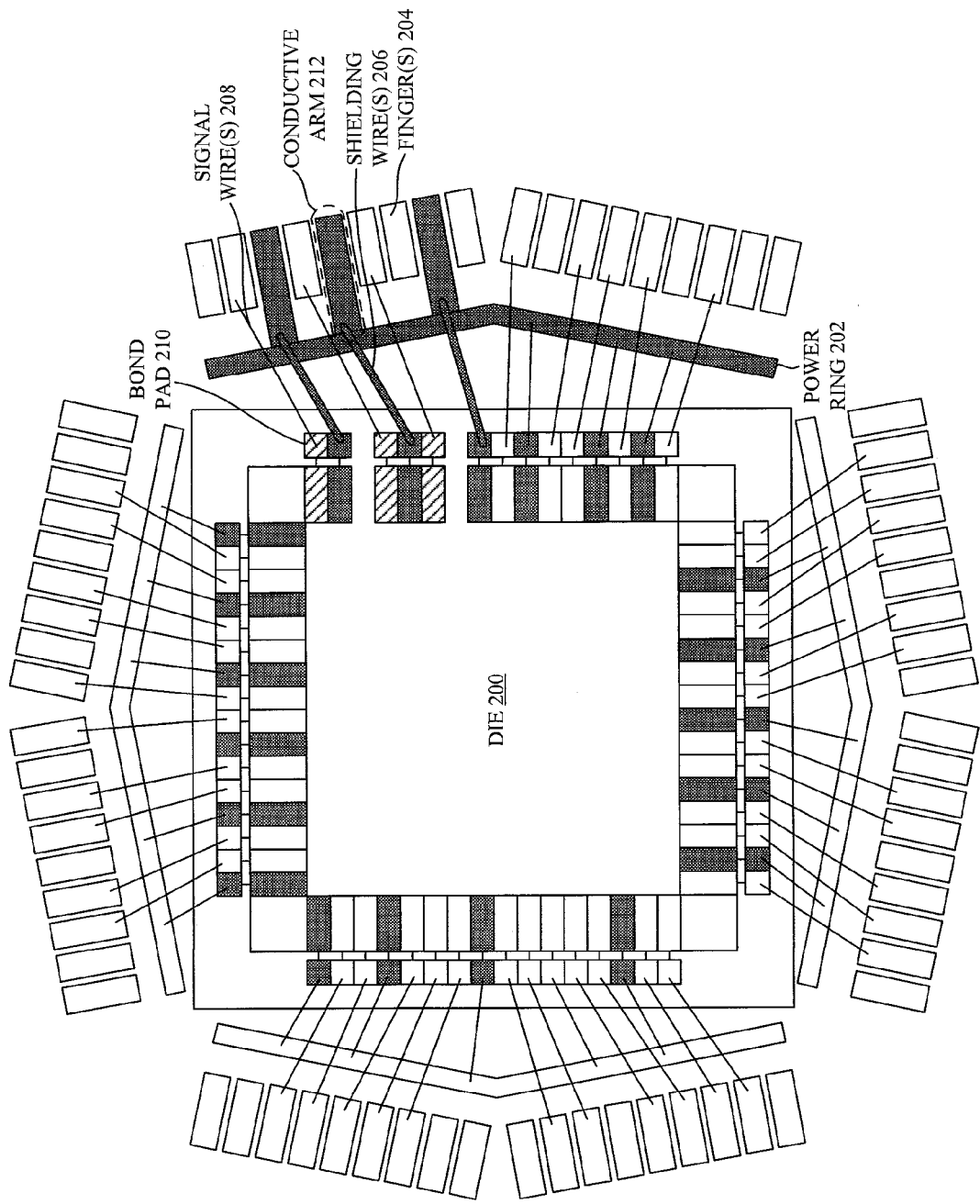
FIG. 2 is a cross-sectional view of a wire bond package and die connection illustrating method of positioning the power ring, according to one embodiment.

In another embodiment, a method includes generating a power ring between an array of fingers and a die, coupling a set of conductive arms (e.g., a conductive arm 212 of FIG. 2) which each perpendicularly extend from the power ring to a location at a farthest edge of each finger of the array of fingers, applying a signal wire between a bond pad of the die and a particular finger of the array of fingers (e.g., fingers 204 of FIG. 2), and applying a shielding wire between an adjacent bond pad and the power ring, such that the shielding wire is substantially equal in length to the signal wire and such that the shielding wire couples to a particular conductive arm of the set of conductive arms rather than to any of the array of fingers (e.g., as described in FIG. 2).

Figure 3:
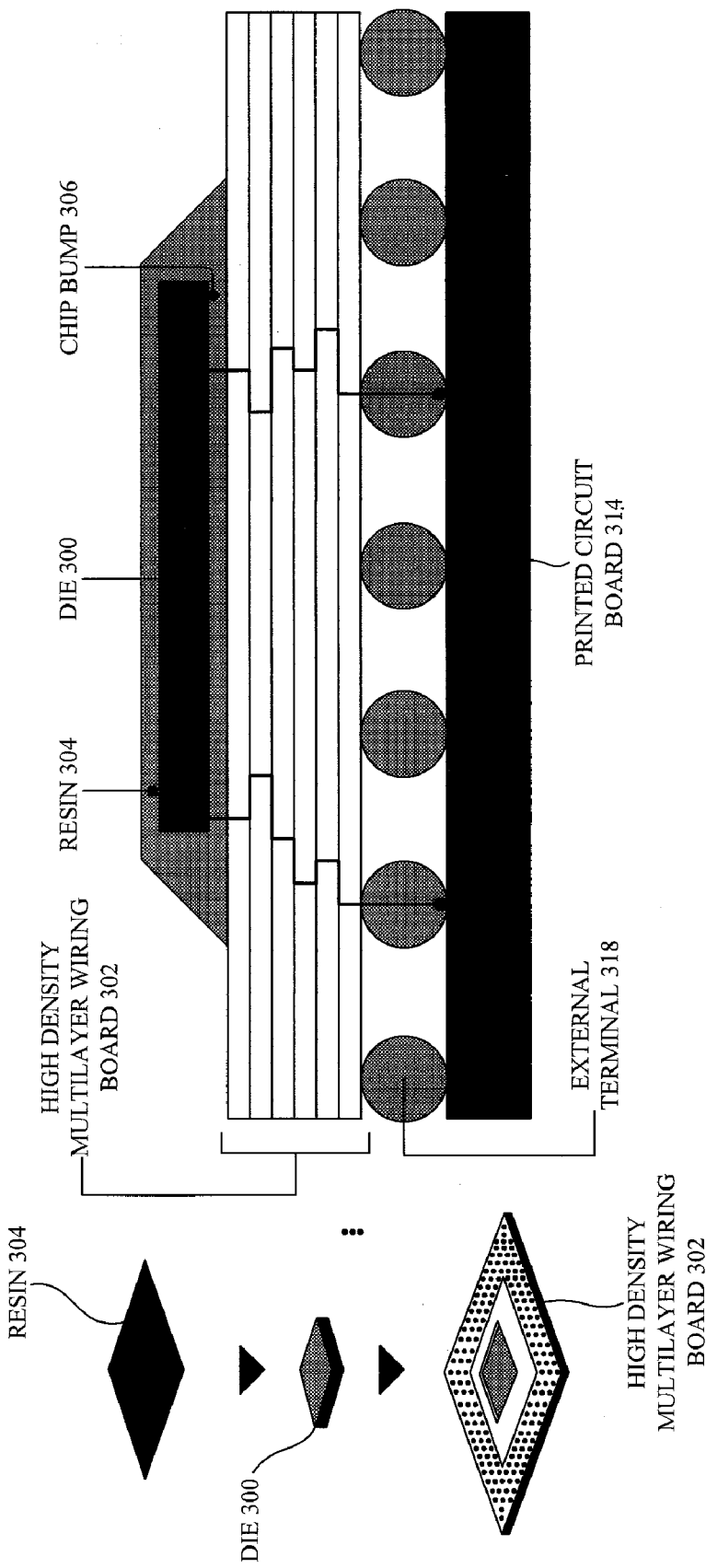
FIG. 3 is an assembly view of microelectronic assembly of a die, according to one embodiment.

In yet another embodiment, a microelectronic assembly includes a die (e.g., a die 300 of FIG. 3) between a high density multilayer wiring board (e.g., a high density multilayer wiring board of FIG. 3) and a resin, a power ring and an array of fingers of the high density wiring board adjacent to the die, a set of conductive arms which each perpendicularly extend from the power ring to a location at a farthest edge of each finger of the array of fingers, a set of signal wires each between a bond pad of the die and a particular finger of the array of fingers, and a set of shielding wires each between an adjacent bond pad and the power ring, such that each shielding wire is substantially equal in length to each signal wire and such that each shielding wire couples to a particular conductive arm of the set of conductive arms rather than to any of the array of fingers (e.g., as described in FIG. 3).

FIG. 1 is a cross-sectional view of a wire bond package and die connection layout, according to one embodiment. Particularly, FIG. 1 illustrates a die 100, a power ring 102, a finger(s) 104, a shielding wire(s) 106, and a signal wire(s) 108, according to one embodiment.

The die 100 may be an integrated circuit (e.g., an optical die, a micro electromechanical system die etc.) that may be bonded upright into the substrate and/or electrically connected (e.g., gold wire, aluminum wire etc.) to the bond pad 110 and traces on the substrate. The power ring 102 may be power and/or ground ring of a wire bond that may be used to supply power and/or ground into a semiconductor device. The finger(s) 104 may be array of bonding site within the package that may connect signals and/or discrete power.

The shielding wire(s) 106 may be a metallic wire (e.g., of copper, aluminum, silver, an aluminum doped alloy etc.) that may be used to carry the input and/or output signals within the semiconductor device. The shielding wire 106 may not couple with array of fingers 104 that may eliminate the usage of shielding input/output devices and hence may reduce the silicon area of the die 100. The signal wire(s) 108 may be a metallic wire (e.g., of copper, aluminum, silver, an aluminum doped alloy etc.) that may be built using regular metal routing layers of the semiconductor design.

The signal wire(s) 108 may connect the bond pad and the associated input/output device (e.g., device used to interface core logic with the external ASIC/ASSP environment). The bond pad 110 may be a site on the periphery of a silicon die (e.g., a Rapid chip, Field programmable die, etc.) that may make connection with one of the bond wire (e.g., the shielding wire 106, the signal wire 108 of FIG. 1).

In example embodiment illustrated in FIG. 1, the die 100 may be installed centrally on a circuit board (e.g., a high density multilayer wiring board 302 of FIG. 2). The power ring 102 as illustrated in FIG. 1 may be located on the high density multilayer wiring board 302 of FIG. 3 to supply power or ground to the semiconductor device. The fingers 104 may be located on the high density multilayer wiring board 302 of FIG. 3 in the form of array. The fingers 104 may be arranged such that each finger 104 connects at least one package ball, according to the example embodiments illustrated in FIG. 1.

The shielding wires 106 may be connected from the bond pad 110 to the power rings 102 and may be placed between adjacent ones of the signal wire 108 to minimize the crosstalk effect as illustrated in example embodiment of FIG. 1. The shielding wire 106 may be made from at least one of metal including copper, aluminum, silver, and an aluminum doped alloy. The shielding wire 106 may not couple with the fingers 104 thereby reduces the silicon area of die 100, according to example embodiment of FIG. 1.

In example embodiment illustrated in FIG. 1, the signal wire 108 may be connected between a bond pad 110 of the die 100 and the finger 104. The signal wire 108 may be shortened from that of design by moving the array of fingers 104 adjacent to the die 100 and thus may minimize the crosstalk effect. The bond pad 110 may be installed on the die 100 as illustrated in example embodiment FIG. 1. The bond pad 110 of the die 100 may be electrically connected to trace of the circuit board through the first bonding line.

The array of fingers 104 may be generated between the power ring 102 and the die 100. The signal wire 108 may be applied between a bond pad of the die 100 and a particular finger of the array of fingers. The shielding wire 106 may be applied between (e.g., the shielding wire 106 may be placed between adjacent ones of the signal wire to minimize crosstalk between the adjacent ones of the signal wire) an adjacent bond pad 110 and the power ring 102, such that the shielding wire 106 is longer than the signal wire 108 and does not couple to any of the array of fingers.

The shielding wire and/or the signal wire may be created from a metal including copper, aluminum, silver, and an aluminum doped alloy. The array of fingers may be moved directly adjacent to the die (e.g., the die 100 of FIG. 1), such that a length of the signal wire decreases by at least 20% from that of a design in which the power ring 102 may be located between the die 100 and the array of fingers. Furthermore, a silicon area of the die (e.g., the die 100 of FIG. 1) may be decreased since separate shielding input/output devices may not be required when the shielding wire 106 does not couple to any of the array of fingers. In addition, an effect of a crosstalk may be minimized when the shielding wire 106 is between two signal wires on either side of the shielding wire 106.

FIG. 2 is a cross-sectional view of a wire bond package and the die (e.g., the die 100 of FIG. 1) connection illustrating method of positioning the power ring 202, according to one embodiment. Particularly, FIG. 2 illustrates a die 200, a power ring 202, a finger(s) 204, a shielding wire(s) 206, a signal wire(s) 208, and a conductive arm 212, according to one embodiment.

The die 200 may be an integrated circuit (e.g., an optical die, a micro electromechanical system die etc.) that may be bonded upright into the substrate and/or electrically connected (e.g., gold wire, aluminum wire etc.) to the bond pad 210 and traces on the substrate. The power ring 202 may be power and/or ground ring of a wire bond that may be used to supply power and/or ground into a semiconductor device. The finger(s) 204 may be array of bonding site with in the package that may connect signals and/or discrete power.

The shielding wire(s) 206 may be a metallic wire (e.g., of copper, aluminum, silver, an aluminum doped alloy etc.) that may be used to carry the input and/or output signals within the semiconductor device and/or may be coupled to the set of conductive arm that may extend perpendicularly from the power ring 202. The signal wire(s) 208 may be a metallic wire (e.g., of copper, aluminum, silver, an aluminum doped alloy etc.) that may be built using regular metal routing layers of the semiconductor design. The signal wire(s) 208 may connect the bond pad (e.g., bond pad 210 of FIG. 2) and the associated input/output device (e.g., device used to interface core logic with the external ASIC/ASSP environment).

The bond pad 210 may be a site on the periphery of a silicon die (e.g., a Rapid chip, a Field programmable die, etc.) that may make connection with one of the bond wire (e.g., the shielding wire 206, the signal wire 208 of FIG. 1). The conductive arms 212 may be coupled with the farthest edge of the fingers 104 to reverse the configurations of the signal and the power ring 202 so that the crosstalk effect may be minimized and also high speed IO signals may be achieved.

In example embodiment illustrated in FIG. 2, the die 200 may be installed centrally on a circuit board (e.g., a high density multilayer wiring board 302 of FIG. 2). The power ring 202 as illustrated in FIG. 2 may be located on the high density multilayer wiring board 302 of FIG. 3 to supply power or ground to the semiconductor device. The power ring 202 may be located between the die 200 and array of fingers 204 when the signal wire 208 shortens and/or array of fingers move adjacent to the die 300. The fingers 204 may be located on the high density multilayer wiring board 302 of FIG. 3 in the form of array. The fingers 204 may be arranged such that each finger 104 connects at least one package ball, according to the example embodiments illustrated in FIG. 2.

The fingers 204 may be moved adjacent to the die 200 such that the length of the signal wire 108 reduces by at least 20% from that of a design and thus may minimize the crosstalk effect. The shielding wires 206 as illustrated in example embodiment of FIG. 2 may be connected from the bond pad 210 to the power rings 202 such that the shielding wire 206 may be substantially equal in length to that of the signal wire (e.g., signal wire(s) 206 of FIG. 2) and/or the shielding wire 206 may couple with the particular conductive arm of set of conductive arm 212. The shielding wire 206 may be placed between adjacent ones of the signal wire 208 to minimize the crosstalk effect as illustrated in example embodiment of FIG. 2. The shielding wire 206 may be made from at least one of metal including copper, aluminum, silver, and an aluminum doped alloy. The shielding wire 206 may not couple with the fingers 204 thereby reduces the silicon area of die 200, according to example embodiment of FIG. 2.

In example embodiment illustrated in FIG. 2, the signal wire 208 may be connected between the bond pad 210 of the die 200 and the finger 204. The signal wire 208 may be shortened from that of design by moving the array of fingers 204 adjacent to the die 200 and thus may minimize the crosstalk effect. The bond pad 210 may be installed on the die 200 as illustrated in example embodiment FIG. 2. The bond pad 210 of the die 200 may be electrically connected through the first bonding line trace of the circuit board. In the example embodiment illustrated in FIG. 2, the conductive arms 212 may extend perpendicularly from the power ring 202 to a location at a farthest edge of each finger (e.g., the finger 204 of FIG. 2) when the location of the power ring 202 is between the die 200 and the array of fingers (e.g., the finger(s) 204 of FIG. 2).

For example, the crosstalk may be reduced by shortening the signal wire (e.g., signal wire(s) 208 of FIG. 2) from a design in which the power ring (e.g., power ring 202 of FIG. 2) is located between the die (e.g., the die 200 of FIG. 2) and the array of fingers 204. A method includes generating a power ring between an array of fingers and the die (e.g., the die 200 of FIG. 2). A set of conductive arms (e.g., the conductive arm 212 of FIG. 2) which each perpendicularly extend from the power ring (e.g., the power ring 202 of FIG. 2) may be coupled to a location at a farthest edge of each finger of the array of fingers.

The signal wire 208 may be applied between a bond pad (e.g., bond pad 210 of FIG. 2) of the die 200 and a particular finger of the array of fingers. Also, a shielding wire 206 may be applied between (e.g., the shielding wire may be placed between adjacent ones of the signal wire 208 to minimize crosstalk between the adjacent ones of the signal wire) an adjacent bond pad (e.g., the bond pad 210 of FIG. 2) and the power ring 202, such that the shielding wire 206 is substantially equal in length to the signal wire 208 and such that the shielding wire 206 couples to a particular conductive arm (e.g., the shielding wire(s) 206 of FIG. 2) of the set of conductive arms rather than to any of the array of fingers.

The shielding wire (e.g., the shielding wire(s) 206 of FIG. 2) and the signal wire (e.g., the signal wire(s) 208 of FIG. 2) may be created from a metal including copper, aluminum, silver, and an aluminum doped alloy. The array of fingers may be moved directly adjacent to the die (e.g., the die 200 of FIG. 2), such that a length of the signal wire (e.g., the signal wire(s) 208 of FIG. 2) decreases by at least 20% from that of a design in which the power ring (e.g., the power ring 202 of FIG. 2) may be located between the die (e.g., the die 200 of FIG. 2) and the array of fingers. Furthermore, a silicon area of the die (e.g., the die 200 of FIG. 2) may be decreased as separate shielding input/output devices may not be required when the shielding wire 206 does not couple to any of the array of fingers. In addition, the method may include minimizing an effect of a crosstalk when the shielding wire 206 is between two signal wires (e.g., the signal wire(s) 208 of FIG. 2) on either side of the shielding wire (e.g., the shielding wire(s) 206 of FIG. 2). The crosstalk may be reduced by shortening the signal wire 208 from a design in which the power ring 202 may be located between the die 200 and the array of fingers.

FIG. 3 is an assembly view of microelectronic assembly of a die 300, according to one embodiment. Particularly, FIG. 3 illustrates a die 300, a high density multilayer wiring board 302, a resin 304, a chip bump 306, a printed circuit board 314, and an external terminal 318, according to one embodiment.

The die 300 be an integrated circuit (e.g., an optical die, a micro electromechanical system die, etc.) that may be bonded upright into the substrate and/or electrically connected (e.g., a gold wire, a aluminum wire etc.) to the bond pad 210 and traces on the substrate. The high density multilayer wiring board 302 may consist of a plurality of green sheets of crystallizable glass laminated and sintered as a unit that may include a printed conductive pattern. The resin 304 may be fillers (e.g., synthetic, natural, etc.) that may be used for the purpose of increasing modulus, lowering coefficient of thermal expansion (CTE) and improving mechanical properties.

The chip bump 306 may be the flip chip attachment to the package with the help of solder bumps. The printed circuit board 314 may be used to mechanically support and/or electrically connect electronic components using conductive pathways, traces, etc. etched from copper sheets laminated onto a non-conductive substrate. The external terminal 318 may be the conductive terminals that may electrically connect the electronic components (e.g., high density multilayer wiring board with printed circuit board 314 of FIG. 3).

In the example embodiment illustrated in FIG. 3, the die 300 may encapsulated between the high density multilayer wiring board 302 and resin 304. The high density multilayer wiring board 302 as illustrated in example embodiment of FIG. 3, containing the die 300 may be electrically connected to the printed circuit board (e.g., the printed circuit board 314 of FIG. 3) through the external terminals (e.g., the external terminal 318 of FIG. 3). The high density multilayer wiring board 302 may contain the power ring (e.g., the power ring 102 and the power ring 202 of FIG. 1 and FIG. 2) and array of fingers (e.g., the fingers 204 and the fingers 204 of FIG. 1 and FIG. 2) located adjacent to the die 300.

In the example embodiment illustrated in FIG. 3, the resin 304 may be placed on the top of the die 300 that may hold down the die 300 into the high density multilayer wiring board 302. The chip bump 306 may be placed on the conductive substrate with its active side down. The printed circuit board 314 illustrated in example embodiment of FIG. 3 may mechanically hold and/or electrically connect the high density multilayer wiring board 302 containing the die 300 using conductive pathways, traces, etc.

For example, a microelectronic assembly includes the die (e.g., the die 300 of FIG. 3) between the high density multilayer wiring board (e.g., the high density multilayer wiring board of FIG. 3) and the resin (e.g., the resin 304 of FIG. 3). The microelectronic assembly also includes a power ring (e.g., the power ring 102 of FIG. 1 and the power ring 202 of FIG. 2) and an array of fingers of the high density wiring board (e.g., the high density multilayer wiring board 302 of FIG. 3) adjacent to the die (e.g., the die 300 of FIG. 3), a set of conductive arms which each perpendicularly extend from the power ring (e.g., the power ring 102 of FIG. 1 and the power ring 202 of FIG. 2) to a location at a farthest edge of each finger of the array of fingers, a set of signal wires each between a bond pad (the bond pad 110 of FIG. 1 and the bond pad 210 of FIG. 2) of the die (e.g., the die 300 of FIG. 3) and a particular finger of the array of fingers and a set of shielding wires each between (e.g., the set of shielding wires may be placed between adjacent ones of each signal wire to minimize crosstalk between the adjacent ones of each signal wire) an adjacent bond pad (the bond pad 110 of FIG. 1 and the bond pad 210 of FIG. 2) and the power ring (e.g., the power ring 102 of FIG. 1 and the power ring 202 of FIG. 2), such that each shielding wire may be substantially equal in length to each signal wire and such that each shielding (e.g., the shielding wire(s) 106 of FIG. 1 the shielding wire(s) 206 of FIG. 2) wire couples to a particular conductive arm (e.g., the conductive arm 212 of FIG. 2) of the set of conductive arms rather than to any of the array of fingers.

In addition, shielding wire (e.g., the shielding wire(s) 106 of FIG. 1 and the shielding wire(s) 206 of FIG. 2) and each signal wire (e.g., the signal wire(s) 108 of FIG. 1 and the signal wire(s) 208 of FIG. 2 may be created from at least one of a metal including copper, aluminum, silver, and an aluminum doped alloy. A silicon area of the die (e.g., the die 300 of FIG. 3) may be decreased because separate shielding input/output devices are not required when the shielding wire (e.g., the shielding wire(s) 106 of FIG. 1 and the shielding wire(s) 206 of FIG. 2) does not couple to any of the array of fingers. Moreover, an effect of a crosstalk may be minimized when each shielding wire is between two signal wires (e.g., the signal wire(s) 108 of FIG. 1 and the signal wire(s) 208 of FIG. 2) on either side of each shielding wire (e.g., the shielding wire(s) 106 of FIG. 1 and the shielding wire(s) 206 of FIG. 2). The crosstalk may be further reduced by shortening each signal wire (e.g., the signal wire(s) 108 of FIG. 1 and the signal wire(s) 208 of FIG. 2) from a design in which the power ring is located between the die and the array of fingers.

Figure 4:
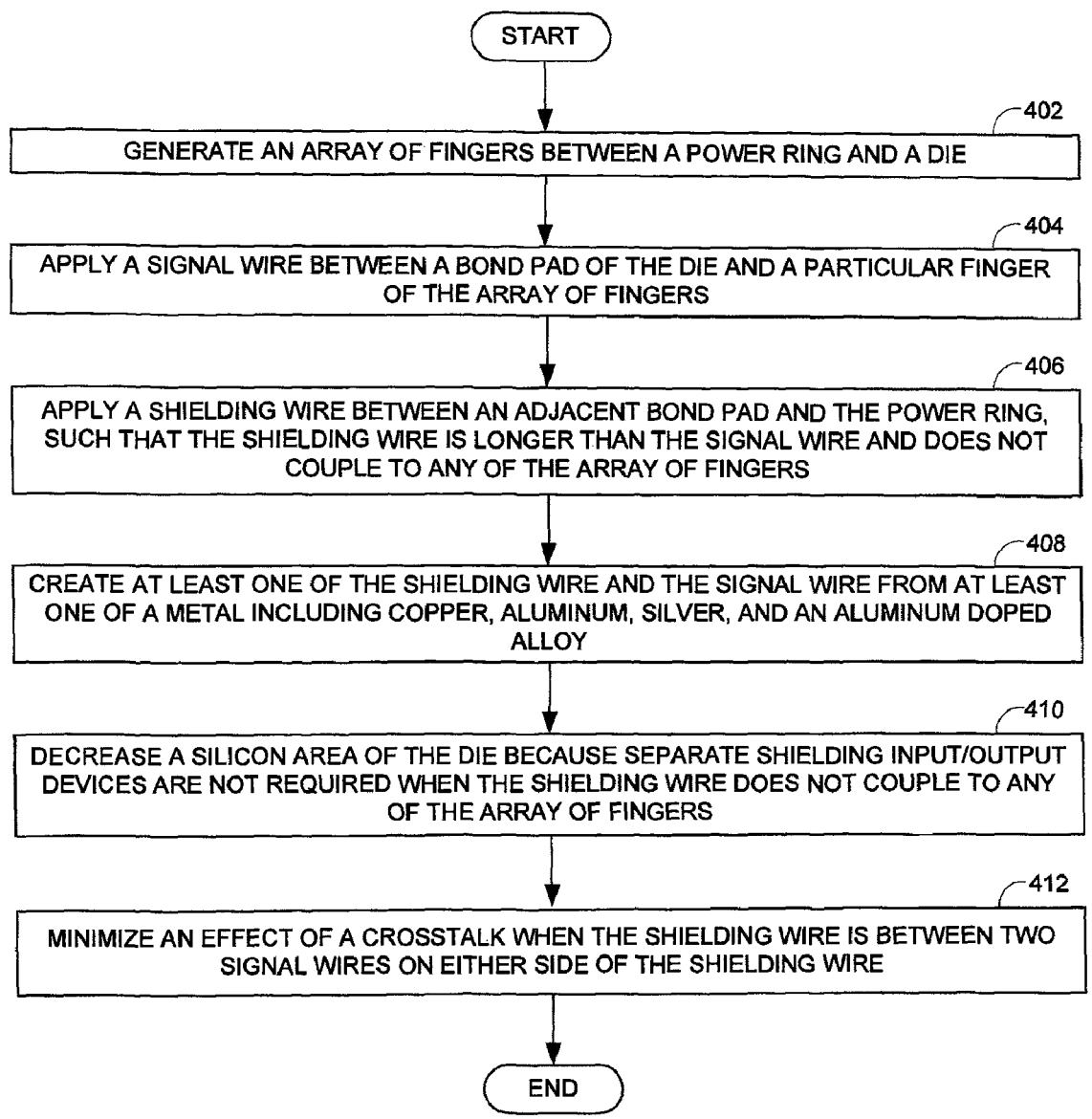
FIG. 4 is a process flow of generating an array of fingers between a power ring and the die, according to one embodiment.

FIG. 4 is a process flow of generating an array of fingers between the power ring (e.g., the power ring 102 of FIG. 1 and the power ring 202 of FIG. 2) and the die (e.g., the die 300 of FIG. 3), according to one embodiment. In operation 402, an array of fingers (e.g., finger(s) 104, 204, of FIG. 1-2) may be generated between a power ring (e.g., power ring 102, 202, of FIG. 1-2) and a die (e.g., die 100, 200, 300 of FIG. 1-3). In operation 404, a signal wire (e.g., signal wire(s) 108, 208 of FIG. 1-2) may be applied between a bond pad (e.g., bond pad 110, 210 of FIG. 1-2) of the die (e.g., die 100, 200, 300, of FIG. 1-3) and a particular finger (e.g., finger(s) 104, 204, of FIG. 1-2) of the array of fingers (e.g., finger(s) 104, 204, of FIG. 1-2).

In operation 406, a shielding wire (e.g., shielding wire(s) 106, 206 of FIG. 1-2) may be applied between an adjacent bond pad (e.g., bond pad 110, 210 of FIG. 1-2) and the power ring (e.g., power ring 102, 202, of FIG. 1-2), such that the shielding wire (e.g., shielding wire(s) 106, 206 of FIG. 1-2) is longer than the signal wire (e.g., signal wire(s) 108, 208 of FIG. 1-2) and does not couple to any of the array of fingers (e.g., finger(s) 104, 204, of FIG. 1-2). In operation 408, at least one of the shielding wire (e.g., shielding wire(s) 106, 206 of FIG. 1-2) and the signal wire may be created from at least one of a metal including copper, aluminum, silver, and an aluminum doped alloy.

In operation 410, a silicon area of the die (e.g., die 100, 200, 300, of FIG. 1-3) may be decreased because separate shielding input/output devices are not required when the shielding wire (e.g., shielding wire(s) 106, 206 of FIG. 1-2) does not couple to any of the array of fingers (e.g., finger(s) 104, 204, of FIG. 1-2). In operation 412, an effect of a crosstalk may be minimized when the shielding wire (e.g., shielding wire(s) 106, 206 of FIG. 1-2) is between two signal wires (e.g., signal wire(s) 108, 208 of FIG. 1-2) on either side of the shielding wire (e.g., shielding wire(s) 106, 206 of FIG. 1-2).

Figure 5:
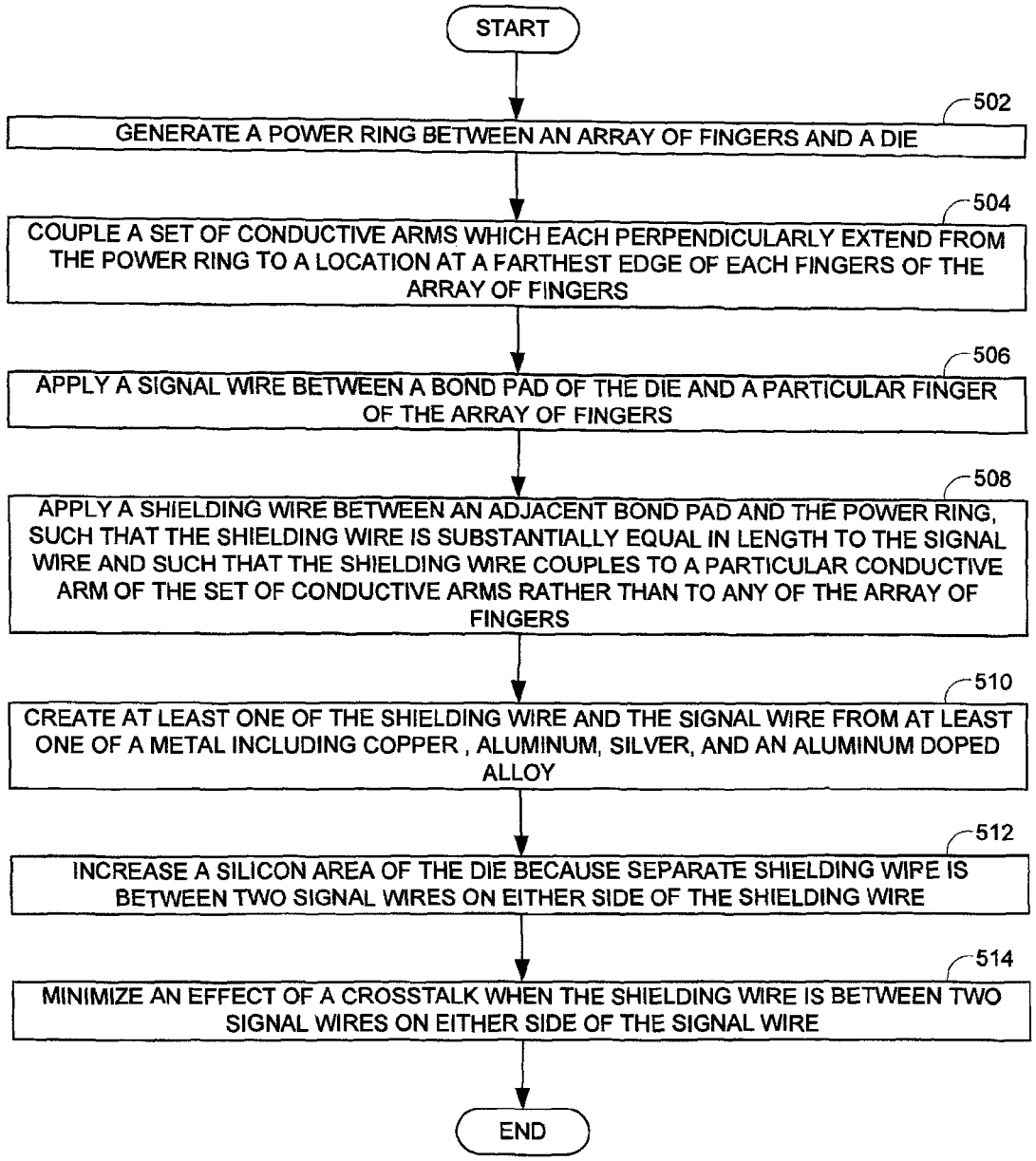
FIG. 5 is a process flow of generating the power ring between the array of fingers and the die, according to one embodiment.

FIG. 5 is a process flow of generating the power ring (e.g., the power ring 102 of FIG. 1 and the power ring 202 of FIG. 2) between the array of fingers and the die, according to one embodiment. In operation 502, a power ring (e.g., power ring 102, 202, of FIG. 1-2) may be generated between an array of fingers (e.g., finger(s) 104, 204, of FIG. 1-2) and a die (e.g., die 100, 200, 300, of FIG. 1-3). In operation 504, a set of conductive arms may be coupled which each perpendicularly extend from the power ring (e.g., power ring 102, 202, of FIG. 1-2) to a location at a farthest edge of each finger (e.g., finger(s) 104, 204, of FIG. 1-2) of the array of fingers (e.g., finger(s) 104, 204, of FIG. 1-2).

In operation 506, a signal wire (e.g., signal wire(s) 108, 208 of FIG. 1-2) may be applied between a bond pad (e.g., bond pad 110,210 of FIG. 1-2) of the die (e.g., die 100,200, 300, of FIG. 1-3) and a particular finger (e.g., finger(s) 104, 204, of FIG. 1-2) of the array of fingers (e.g., finger(s) 104, 204, of FIG. 1-2). In operation 508, a shielding wire (e.g., shielding wire(s) 106, 206 of FIG. 1-2) may be applied between an adjacent bond pad (e.g., bond pad 110, 210 of FIG. 1-2) and the power ring (e.g., power ring 102, 202, of FIG. 1-2), such that the shielding wire (e.g., shielding wire(s) 106, 206, of FIG. 1-2) is substantially equal in length to the signal wire (e.g., signal wire(s) 108, 208, of FIG. 1-2) and such that the shielding wire (e.g., shielding wire(s) 106, 206 of FIG. 1-2) couples to a particular conductive arm (e.g., conductive arm 212 of FIG. 2) of the set of conductive arms rather than to any of the array of fingers (e.g., finger(s) 104, 204, of FIG. 1-2).

In operation 510, at least one of the shielding wire (e.g., shielding wire(s) 106, 206 of FIG. 1-2) and the signal wire (e.g., signal wire(s) 108, 208 of FIG. 1-2) may be created from at least one of a metal including copper, aluminum, silver, and an aluminum doped alloy. In operation 512, a silicon area of the die (e.g., die 100, 200, 300, of FIG. 1-3) may be decreased because separate shielding input/output devices are not required when the shielding wire (e.g., shielding wire(s) 106, 206 of FIG. 1-2) does not couple to any of the array of fingers (e.g., finger(s) 104, 204, of FIG. 1-2). In operation 514, an effect of a crosstalk may be minimized when the shielding wire (e.g., shielding wire(s) 106, 206 of FIG. 1-2) is between two signal wires (e.g., signal wire(s) 108, 208 of FIG. 1-2) on either side of the shielding wire (e.g., shielding wire(s) 106, 206 of FIG. 1-2).

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/ or software (e.g., embodied in a machine readable medium). For example, the various electrical structure and methods may be embodied using transistors, logic gates, and electrical circuits (e.g., application specific integrated (ASIC) circuitry and/or in Digital Signal Processor (DSP) circuitry).

In addition, it will be appreciated that the various operations, processes, and methods disclosed herein may be embodied in a machine-readable medium and/or a machine accessible medium compatible with a data processing system (e.g., a computer system), and may be performed in any order (e.g., including using means for achieving the various operations). Accordingly, the specification and drawings are to be regarded in an illustrative rather than a restrictive sense.

What is claimed is:

1. A microelectronic assembly comprising:
   a die between a high density multilayer wiring board and a resin;
   a power ring and an array of fingers of the high density multilayer wiring board adjacent to the die;
   a set of conductive arms which each perpendicularly extend from the power ring to a location at a farthest edge of each finger of the array of fingers;
   a set of signal wires each between a bond pad of the die and a particular finger of the array of fingers; and
   a set of shielding wires each between an adjacent bond pad and the power ring, such that each shielding wire is substantially equal in length to each signal wire and such that each shielding wire couples to a particular conductive arm of the set of conductive arms rather than to any of the array of fingers.

2. The microelectronic assembly of claim 1 wherein the set of shielding wires are placed between adjacent ones of each signal wire to minimize crosstalk between the adjacent ones of each signal wire.

3. The microelectronic assembly of claim 1 further comprising creating at least one of each shielding wire and each signal wire from at least one of a metal including copper, aluminum, silver, and an aluminum doped alloy.

4. The microelectronic assembly of claim 1 wherein the array of fingers are moved directly adjacent to the die, such that a length of the signal wire decreases by at least 20% from that of a design in which the power ring is located between the die and the array of fingers.

5. The microelectronic assembly of claim 1 further comprising decreasing a silicon area of the die because separate shielding input/output devices are not required when the shielding wire does not couple to any of the array of fingers.

6. The microelectronic assembly of claim 1 further comprising minimizing an effect of a crosstalk when each shielding wire is between two signal wires on either side of each shielding wire, and wherein the crosstalk is further reduced by shortening each signal wire from a design in which the power ring is located between the die and the array of fingers.

* * * * *